United States Patent
Fujii et al.

(10) Patent No.: US 8,728,283 B2
(45) Date of Patent: *May 20, 2014

(54) PROCESS FOR FORMING A FILM, PIEZOELECTRIC FILM, PIEZOELECTRIC DEVICE, AND LIQUID DISCHARGE APPARATUS

(75) Inventors: Takamichi Fujii, Kanagawa-ken (JP); Yukio Sakashita, Kanagawa-ken (JP)

(73) Assignee: FUJIFILM Corporation, Tokyo (JP)

(*) Notice: Subject to any disclaimer, the term of this patent is extended or adjusted under 35 U.S.C. 154(b) by 1222 days.

This patent is subject to a terminal disclaimer.

(21) Appl. No.: 11/905,130

(22) Filed: Sep. 27, 2007

(65) Prior Publication Data

US 2008/0081216 A1    Apr. 3, 2008

(30) Foreign Application Priority Data

Sep. 28, 2006  (JP) .................... 2006-263978

(51) Int. Cl.
C23C 14/46 (2006.01)
C23C 14/34 (2006.01)

(52) U.S. Cl.
USPC .................... 204/192.1; 204/192.11

(58) Field of Classification Search
USPC .................. 204/192.11; 427/523, 569, 581
See application file for complete search history.

(56) References Cited

U.S. PATENT DOCUMENTS

| | | | |
|---|---|---|---|
| 5,849,163 A | 12/1998 | Ichikawa et al. | |
| 2001/0027167 A1 | 10/2001 | Kawakubo et al. | |
| 2005/0162047 A1 | 7/2005 | Torii et al. | |

FOREIGN PATENT DOCUMENTS

| | | |
|---|---|---|
| EP | 0 458 991 A1 | 12/1991 |
| EP | 1 560 279 A2 | 8/2005 |
| JP | 3-187996 A | 8/1991 |
| JP | 6-49638 A | 2/1994 |
| JP | 10-60653 A | 3/1998 |
| JP | 2000-72415 A | 3/2000 |
| JP | 2003-118104 A | 4/2008 |

OTHER PUBLICATIONS

Yang, et al., "In-situ Ellipsometry Study of Ion Bombardment Effects on Low Temperature Si Epitaxy by dc Magnetron Sputtering", Mat. Res. Soc. Symp. Proc. vol. 354, 1995, pp. 75-80, Materials Research Society.
Medjani, et al., "Effect of substrate temperature and bias voltage on the crystallite orientation in RF magnetron sputtered AlN thin films," Thin Solid Films, 515 (2006), pp. 260-265, Elsevier B. V., Lausanne, Switzerland.
Office Action issued in corresponding European patent application No. 07 018 954.3-2222 issued on Apr. 22, 2010.
Ceramics, vol. 21, No. 2, pp. 119-125, 1986.

*Primary Examiner* — Roy King
*Assistant Examiner* — Jenny Wu
(74) *Attorney, Agent, or Firm* — Birch, Stewart, Kolasch & Birch, LLP

(57) ABSTRACT

Film formation conditions are determined in accordance with relationships among a film formation temperature Ts (° C.), a difference Vs−Vf (V), which is the difference between a plasma potential Vs (V) in the plasma at the time of the film formation and a floating potential Vf (V), and characteristics of the formed film. For a piezoelectric film containing at least one kind of Pb-containing perovskite type oxide, the film formation conditions should preferably be determined within a range such that Formulas (1) and (2) shown below are satisfied:

$$Ts(°\,C.) \geq 400 \quad (1)$$

$$-0.2Ts + 100 < Vs - Vf(V) < -0.2Ts + 130 \quad (2)$$

14 Claims, 7 Drawing Sheets

PROCESS FOR FORMING A FILM, PIEZOELECTRIC FILM, PIEZOELECTRIC DEVICE, AND LIQUID DISCHARGE APPARATUS

BACKGROUND OF THE INVENTION

1. Field of the Invention

This invention relates to a process for forming a film, in which the film is formed with a vapor phase growth technique utilizing plasma, and a piezoelectric film having been formed by use of the process for forming a film. This invention also relates to a piezoelectric device, which comprises the piezoelectric film, and a liquid discharge apparatus, which is provided with the piezoelectric device.

2. Description of the Related Art

Piezoelectric devices provided with a piezoelectric film, which has piezoelectric characteristics such that the piezoelectric film expands and contracts in accordance with an increase and a decrease in electric field applied across the piezoelectric film, and electrodes for applying the electric field across the piezoelectric film have heretofore been used as actuators to be loaded on ink jet type recording heads, and the like. As piezoelectric materials, there have heretofore been known perovskite type oxides, such as lead zirconate titanate (PZT).

The piezoelectric films are capable of being formed with vapor phase growth techniques, such as a sputtering technique. As for piezoelectric films, which contain Pb-containing perovskite type oxides, such as PZT, the problems are encountered in that, in cases where the film formation is performed at high temperatures, a Pb-poor state is apt to occur. Therefore, as for the piezoelectric films, which contain the Pb-containing perovskite type oxides, it is necessary to find film formation conditions, under which a perovskite crystal containing little pyrochlore phase is capable of growing appropriately and under which the Pb-poor state is not apt to occur.

For example, in "Fabrication Process of New Ceramic Thin Films—Epitaxial Growth of Compound Thin Films—", Ceramics, Vol. 21, No. 2, pp. 119-125, 1986, appropriate film formation conditions for a piezoelectric film are found with processing, wherein the conditions other than the film formation temperature are set at predetermined values, and wherein the film formation temperature is set at various different values. In FIG. 3 of "Fabrication Process of New Ceramic Thin Films—Epitaxial Growth of Compound Thin Films—", Ceramics, Vol. 21, No. 2, pp. 119-125, 1986, it is illustrated as for a $PbTiO_3$ film that the pyrochlore phase structure is formed approximately at a film formation temperature of at most 500° C., that the perovskite crystal grows approximately at a film formation temperature falling within the range of 550° C. to 700° C., and that an amorphous structure is formed approximately at a film formation temperature of at least 700° C.

Also, for example, in Japanese Unexamined Patent Publication No. 6(1994)-049638, as for a PZT film, relationship between a film formation pressure and a Pb quantity in the film and relationship between the film formation temperature and the Pb quantity in the film are found. (Reference may be made to FIG. 1 and FIG. 2 of Japanese Unexamined Patent Publication No. 6(1994)-049638.) In Japanese Unexamined Patent Publication No. 6(1994)-049638, it is described that the film formation pressure should preferably fall within the range of 1 mTorr to 100 mTorr, and that the film formation temperature should preferably fall within the range of 600° C. to 700° C. (Reference may be made to claim 2 and claim 5 of Japanese Unexamined Patent Publication No. 6(1994)-049638.)

As described in "Fabrication Process of New Ceramic Thin Films—Epitaxial Growth of Compound Thin Films—", Ceramics, Vol. 21, No. 2, pp. 119-125, 1986 and Japanese Unexamined Patent Publication No. 6(1994)-049638, it has heretofore been reported that the condition of the film formation temperature falling within the range of 550° C. to 700° C. is preferable for the piezoelectric film containing the Pb-containing perovskite type oxide, such as PZT. However, studies conducted by the inventors revealed that, in cases where the film formation temperature is as low as approximately 420° C. to 480° C., the perovskite crystal containing little pyrochlore phase is capable of growing, and a piezoelectric film exhibiting good piezoelectric characteristics is capable of being obtained. The capability of the film formation at a comparatively low temperature is preferable for the suppression of the occurrence of the Pb-poor state.

Regardless of whether Pb is or is not contained, in cases where the film formation temperature is high, stress is exerted upon the piezoelectric film during the film formation or during a temperature lowering stage after the film formation, and the like, due to a difference in thermal expansion coefficient between a base plate and the piezoelectric film, and there is the risk that cracks, and the like, will occur in the film. Therefore, it is preferable that the film formation is capable of being performed at a comparatively low temperature. In cases where the film formation is capable of being performed at a comparatively low temperature, for example, a base plate having a comparatively low heat resistance, such as a glass base plate, is capable of being utilized, and the flexibility in selection of the base plate is thus capable of being kept high.

Besides the temperature and the pressure, certain factors have effects upon the film formation of the piezoelectric film. It is considered that, in cases where the factors having the effects upon the film characteristics fall within appropriate ranges, the perovskite crystal containing little pyrochlore phase grows.

SUMMARY OF THE INVENTION

The primary object of the present invention is to clarify factors of film formation conditions, which factors have effects upon film characteristics in a vapor phase growth technique utilizing plasma, such as a sputtering technique, and thereby to provide a process for forming a film, wherein a film having good quality is capable of being formed reliably with the vapor phase growth technique utilizing plasma, such as the sputtering technique.

Another object of the present invention is to provide a process for forming a piezoelectric film, wherein a perovskite crystal containing little pyrochlore phase is capable of being caused to grow reliably.

A further object of the present invention is to provide a piezoelectric film having been formed with the process for forming a piezoelectric film.

A still further object of the present invention is to provide a process for forming a piezoelectric film, which contains a Pb-containing perovskite type oxide, such as PZT, wherein a perovskite crystal containing little pyrochlore phase is capable of being caused to grow reliably and wherein the occurrence of a Pb-poor state is capable of being suppressed reliably.

Another object of the present invention is to provide a piezoelectric film having been formed with the process for forming a piezoelectric film, which contains a Pb-containing perovskite type oxide, such as PZT.

The inventors eagerly conducted studies for solving the problems described above and found that, in the vapor phase growth technique utilizing plasma, such as the sputtering technique, characteristics of the formed film markedly depend upon two factors, i.e. a film formation temperature Ts (° C.) and a difference Vs–Vf (V) between a plasma potential Vs (V) in the plasma and a floating potential Vf (V), and that optimization of the two factors described above enables a film having good quality to be formed. The present invention is based upon the findings described above.

The present invention provides a process for forming a film, in which the film is formed with a vapor phase growth technique utilizing plasma, the process comprising the steps of: determining film formation conditions in accordance with relationships among:

i) a film formation temperature Ts (° C.), ii) a difference Vs–Vf (V), which is the difference between a plasma potential Vs (V) in the plasma at the time of the film formation and a floating potential Vf (V), and iii) characteristics of the formed film.

The term "film formation temperature Ts (° C.)" as used herein means the center temperature of a base plate, on which the film is to be formed.

Also, each of the term "plasma potential Vs" and the term "floating potential Vf" as used herein means the value as measured with a single probe technique utilizing a Langmuir probe. Such that an error may not occur due to clinging of the film, which is being formed, or the like, to the probe, the measurement of the floating potential Vf should be performed as quickly as possible with a probe end being located in the vicinity of the base plate (at a position approximately 10 mm spaced from the base plate).

The potential difference Vs–Vf (V) between the plasma potential Vs and the floating potential Vf is capable of being converted directly into an electron temperature (eV). The electron temperature of 1 eV corresponds to 11,600K (where K represents the absolute temperature).

The process for forming a film in accordance with the present invention is applicable to the cases where a film is formed with the vapor phase growth technique utilizing the plasma. Examples of the films, to which the process for forming a film in accordance with the present invention is applicable, include an electrical insulating film, a dielectric film, and a piezoelectric film.

The process for forming a film in accordance with the present invention is capable of being applied appropriately to the film formation of a piezoelectric film containing at least one kind of perovskite type oxide, which piezoelectric film may contain inevitable impurities. The piezoelectric film containing the perovskite type oxide is a ferroelectric film, which exhibits spontaneous polarization characteristics at the time free from voltage application.

In cases where the process for forming a film in accordance with the present invention is applied to the film formation of a piezoelectric film containing at least one kind of perovskite type oxide, which piezoelectric film may contain inevitable impurities, the perovskite type oxide being represented by General Formula (P) shown below, the film formation conditions should preferably be determined within a range such that Formulas (1) and (2) shown below are satisfied, and should more preferably be determined within a range such that Formulas (1), (2), and (3) shown below are satisfied:

$$\text{General Formula } A_a B_b O_3 \tag{P}$$

wherein A represents the element at the A site and represents at least one kind of element, including Pb, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, Ni, and lanthanide elements, and O represents the oxygen atom, the standard composition being such that a=1.0, and at the same time b=1.0, with the proviso that each of the value of a and the value of b may deviate from 1.0 within a range such that the perovskite structure is capable of being formed, $$Ts(° C.) \geq 400 \tag{1}$$

$$-0.2Ts+100 < Vs-Vf(V) < -0.2Ts+130 \tag{2}$$

$$10 \leq Vs-Vf(V) \leq 35 \tag{3}$$

The present invention also provides a piezoelectric film containing at least one kind of perovskite type oxide, which piezoelectric film may contain inevitable impurities, the perovskite type oxide being represented by General Formula (P) shown below, wherein the piezoelectric film has been formed with a vapor phase growth technique utilizing plasma, and the piezoelectric film has been formed under film formation conditions satisfying Formulas (1) and (2) shown below, preferably under film formation conditions satisfying Formulas (1), (2), and (3) shown below:

$$\text{General Formula } A_a B_b O_3 \tag{P}$$

wherein A represents the element at the A site and represents at least one kind of element, including Pb, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, Ni, and lanthanide elements, and O represents the oxygen atom, the standard composition being such that a=1.0, and at the same time b=1.0, with the proviso that each of the value of a and the value of b may deviate from 1.0 within a range such that the perovskite structure is capable of being formed, $$Ts(° C.) \geq 400 \tag{1}$$

$$-0.2Ts+100 < Vs-Vf(V) < -0.2Ts+130 \tag{2}$$

$$10 \leq Vs-Vf(V) \leq 35 \tag{3}$$

The present invention is applicable appropriately to PZT, which may be represented by General Formula (P-1) shown below, a B site substituted system of PZT described above, and a mixed crystal system containing PZT described above and the B site substituted system of PZT described above:

$$Pb_a(Zr_{b1}Ti_{b2}X_{b3})O_3 \tag{P-1}$$

wherein X represents at least one kind of metallic element selected from the group consisting of Group V and Group VI elements, $a > 0$, $b1 > 0$, $b2 > 0$, and $b3 \geq 0$, the standard composition being such that a=1.0, and at the same time b1+b2+b3=1.0, with the proviso that each of the value of a and the value of b1+b2+b3 may deviate from 1.0 within a range such that the perovskite structure is capable of being formed.

With the present invention, it is possible to provide the piezoelectric film, in which 1.0≤a, preferably 1.0≤a≤1.3, and which is free from a Pb-poor state.

The present invention further provides a piezoelectric device, comprising:
  i) a piezoelectric film in accordance with the present invention, and
  ii) electrodes for applying an electric field across the piezoelectric film.

The present invention still further provides a liquid discharge apparatus, comprising:
  i) a piezoelectric device in accordance with the present invention, and
  ii) a liquid storing and discharging member provided with:
    a) a liquid storing chamber, in which a liquid is to be stored, and
    b) a liquid discharge opening, through which the liquid is to be discharged from the liquid storing chamber to the exterior of the liquid storing chamber.

The present invention clarifies that the factors of the film formation conditions, which factors have the effects upon the film characteristics, in the vapor phase growth technique utilizing the plasma, such as the sputtering technique, are (i) the film formation temperature Ts (° C.), and (ii) the difference Vs−Vf (V), which is the difference between the plasma potential Vs (V) in the plasma at the time of the film formation and the floating potential Vf (V).

With the process for forming a film in accordance with the present invention, wherein the film formation conditions are determined in accordance with the relationships among the two factors described above, which have the effects upon the film characteristics, and the characteristics of the formed film, the film having good quality is capable of being formed reliably with the vapor phase growth technique utilizing the plasma, such as the sputtering technique.

The process for forming a film in accordance with the present invention is capable of being applied appropriately to the formation of the piezoelectric film, and the like. With the present invention, in cases where the piezoelectric film containing the perovskite type oxide is to be formed, the perovskite crystal containing little pyrochlore phase is capable of being caused to grow reliably. Also, with the present invention, in cases where the piezoelectric film containing the Pb-containing perovskite type oxide, such as PZT, is to be formed, the perovskite crystal containing little pyrochlore phase is capable of being caused to grow reliably, and the occurrence of the Pb-poor state is capable of being suppressed reliably.

BRIEF DESCRIPTION OF THE DRAWINGS

FIG. 11 shows the areas encompassed at a variety of film formation temperatures when Vs−Vf(V)=−0.2Ts+100, −0.2Ts+106, −0.18Ts+98.4, −0.2Ts+127 and −0.2Ts+130.

DESCRIPTION OF THE PREFERRED EMBODIMENTS

The present invention will hereinbelow be described in further detail with reference to the accompanying drawings.

[Process for Forming a Film]

The process for forming a film in accordance with the present invention, in which the film is formed with the vapor phase growth technique utilizing the plasma, comprises the steps of: determining the film formation conditions in accordance with the relationships among:
  i) the film formation temperature Ts (° C.),
  ii) the difference Vs−Vf (V), which is the difference between the plasma potential Vs (V) in the plasma at the time of the film formation and the floating potential Vf (V), and
  iii) the characteristics of the formed film.

Examples of the vapor phase growth techniques, which may be employed in the process for forming a film in accordance with the present invention, include the sputtering technique, an ion beam sputtering technique, an ion plating technique, and a plasma enhanced chemical vapor deposition (CVD) technique. Examples of the characteristics of the film, the relationships of which are to be utilized in the process for forming a film in accordance with the present invention, include a crystal structure of the film and/or a film composition.

Figure 1A:
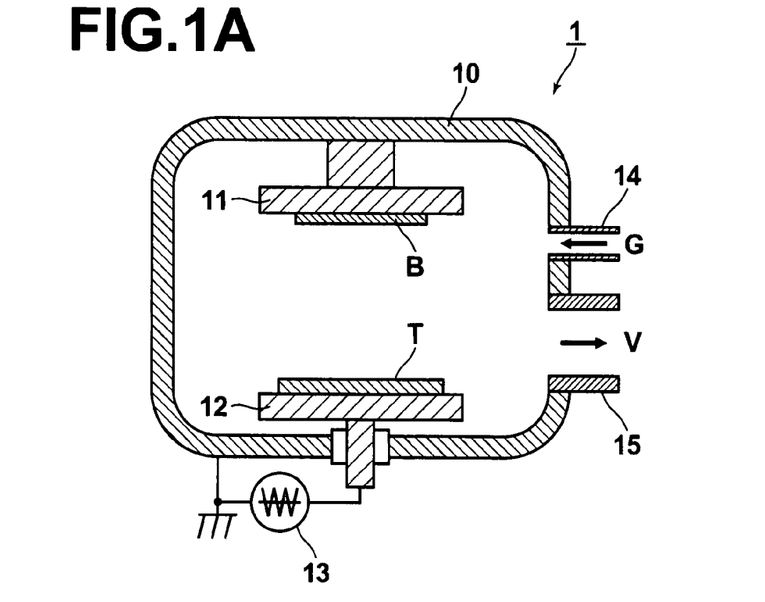
FIG. 1A is a schematic sectional view showing an RF sputtering apparatus.
Figure 1B:
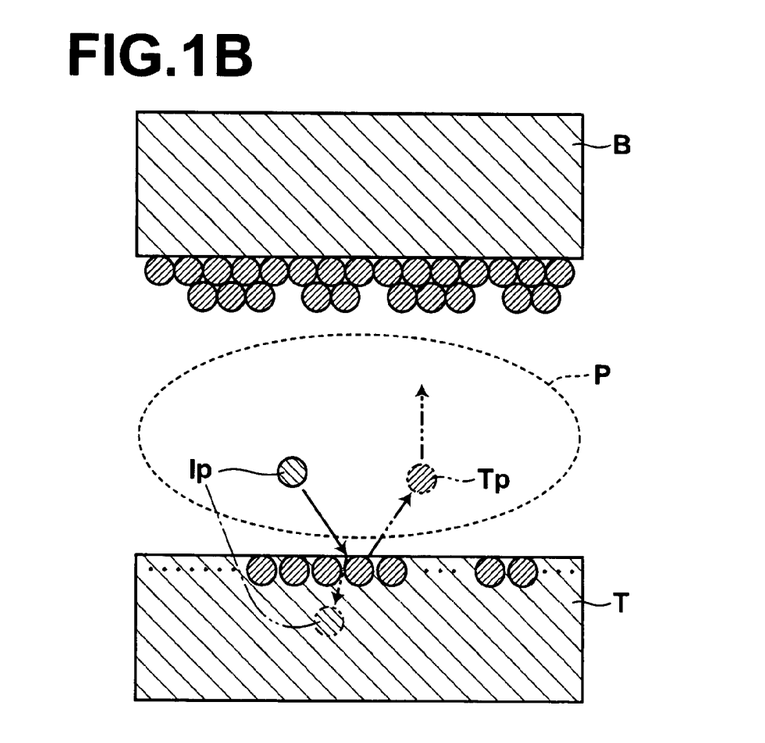
FIG. 1B is an explanatory view showing how a film is formed.

An example of a film forming apparatus utilizing the plasma will be described hereinbelow with reference to FIGS. 1A and 1B by taking a sputtering apparatus as an example. FIG. 1A is a schematic sectional view showing an RF sputtering apparatus. FIG. 1B is an explanatory view showing how a film is formed.

As illustrated in FIG. 1A, an RF sputtering apparatus 1 is approximately constituted of a vacuum chamber 10, in which a heater 11 and a plasma electrode (a cathode electrode) 12 are provided. A base plate B is located on the heater 11, and the heater 11 is capable of heating the base plate B to a predetermined temperature. The plasma electrode 12 acts to generate the plasma. The heater 11 and the plasma electrode 12 are located at a spacing from each other so as to stand facing each other. Also, a target T having a composition in accordance with the composition of the film to be formed is located on the plasma electrode 12. The plasma electrode 12 is connected to a radio frequency electric power source 13.

The vacuum chamber 10 is provided with a gas introducing pipe 14, through which a gas G necessary for the film formation is to be introduced into the vacuum chamber 10. The vacuum chamber 10 is also provided with a gas exhaust pipe 15, through which an exhaust gas V is to be taken out from the vacuum chamber 10. As the gas G, an Ar gas, an $Ar/O_2$ mixed gas, or the like, is utilized. As illustrated in FIG. 1B, the gas G having been introduced into the vacuum chamber 10 is converted into the plasma by electrical discharge of the plasma electrode 12, and a plus ion Ip, such as an Ar ion, is thereby produced. The plus ion Ip having thus been produced sputters the target T. A constituent element Tp of the target T having thus been sputtered by the plus ion Ip is released from the target T and is deposited on the base plate B in a neutral state or in an ionized state. In FIG. 1B, a reference letter P represents a plasma space.

The potential of the plasma space P constitutes the plasma potential Vs (V). Ordinarily, the base plate B is an electrical insulator and is electrically isolated from the ground. Therefore, the base plate B is in a floating state, and the potential of the base plate B constitutes the floating potential Vf (V). It is considered that the constituent element Tp of the target T, which constituent element is located between the target T and the base plate B, collides with the base plate B during the film formation by having kinetic energy corresponding to acceleration voltage of the potential difference Vs–Vf between the potential of the plasma space P and the potential of the base plate B.

Figure 2:
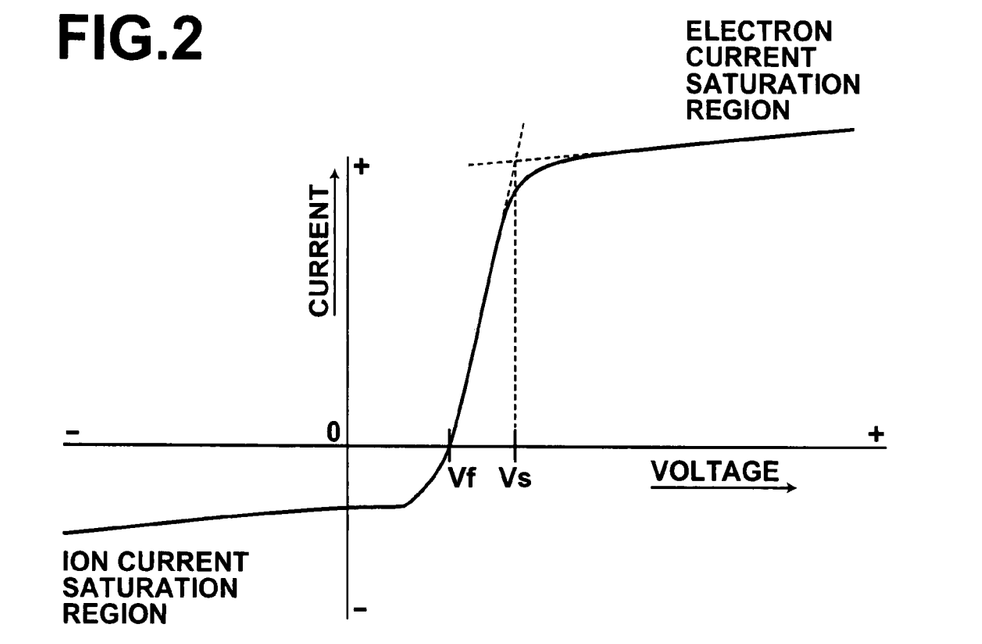
FIG. 2 is an explanatory view showing how a plasma potential Vs and a floating potential Vf are measured.

The plasma potential Vs and the floating potential Vf are capable of being measured by use of the Langmuir probe. In cases where the end of the Langmuir probe is inserted into the plasma P, and the voltage applied to the probe is altered, current-voltage characteristics as illustrated in, for example, FIG. 2, are obtained. (Reference may be made to "Fundamentals of Plasma and Film Formation," Mitsuharu Konuma, p. 90, published by Nikkan Kogyo Shinbun-sha.) In FIG. 2, the probe potential, at which the current becomes equal to zero, is the floating potential Vf. In this state, the quantities of the ion current and the electron current flowing into the probe surface become equal to each other. A metal surface and the base plate surface in the electrically isolated state are set at the floating potential Vf. In cases where the probe voltage is successively set at values higher than the floating potential Vf, the ion current decreases successively, and only the electron current reaches the probe. The voltage at the boundary is the plasma potential Vs.

The value of Vs–Vf is capable of being altered with, for example, the processing in which a ground wire is located between the base plate and the target. (Reference may be made to Examples 1, 2, and 3 described later.)

Examples of the factors, which have the effects upon the characteristics of the film formed with the vapor phase growth technique utilizing the plasma, may include the film formation temperature, the kind of the base plate, the composition of a primary coat in cases where a film has been formed previously on the base plate, the surface energy of the base plate, the film formation pressure, the oxygen quantity in the ambient gas, the loaded electrode, the base plate-target distance, the electron temperature and the electron density in the plasma, the active moiety density in the plasma, and the service life of the active moiety.

The inventors found that, of various film formation factors, the characteristics of the formed film markedly depend upon the two factors, i.e. the film formation temperature Ts and the difference Vs–Vf, and that the optimization of the two factors described above enables the film having good quality to be formed. Specifically, the inventors found that, in cases where the film characteristics are plotted on a graph, in which the horizontal axis represents the film formation temperature Ts, and in which the vertical axis represents the difference Vs–Vf, a film having good quality is capable of being formed within a certain range. (Reference may be made to FIG. 11.)

As described above, the difference Vs–Vf has the correlation with the kinetic energy of the constituent element Tp of the target T, which constituent element collides with the base plate B. Ordinarily, as represented by the formula shown below, the kinetic energy E may be represented by a function of the temperature T. Therefore, it is considered that the difference Vs–Vf has the effects identical with the effects of the temperature upon the base plate B.

$$E=1/2\, mv^2=3/2\, kT$$

wherein m represents the mass, v represents the velocity, k represents the constant, and T represents the absolute temperature.

It is considered that, besides the effects identical with the effects of the temperature, the difference Vs–Vf also has the effects of promoting surface migration, the effects of etching weak binding regions, and the like.

A technique, in which a bias is applied to a base plate for relaxation of a tensile stress exerted upon a piezoelectric film at the time of film formation of the piezoelectric film with the sputtering technique, is proposed in, for example, Japanese Unexamined Patent Publication No. 2004-119703. The application of the bias to the base plate results in alteration of the energy quantity of the constituent element of the target, which constituent element impinges upon the base plate. However, in Japanese Unexamined Patent Publication No. 2004-119703, nothing is described with respect to the plasma potential Vs and the difference Vs–Vf, which is the difference between the plasma potential Vs and the floating potential Vf.

Ordinarily, the difference Vs–Vf in a certain film forming apparatus is approximately fixed by the structure of the film forming apparatus and is not capable of being altered markedly. Therefore, heretofore, there has been little idea of altering the difference Vs–Vf. The only example is a process for forming a film, such as an amorphous silicon film, with a radio frequency plasma enhanced CVD technique, as disclosed in Japanese Unexamined Patent Publication No. 10(1998)-060653, wherein the difference Vs–Vf is controlled at a value falling within a specific range. With the invention disclosed in Japanese Unexamined Patent Publication No. 10(1998)-060653, the difference Vs–Vf is controlled at a value falling within the specific range in order for the problems to be prevented from occurring in that the difference Vs–Vf becomes nonuniform on a base plate surface. However, in Japanese Unexamined Patent Publication No. 10(1998)-060653, nothing is described with respect to the determination of the film formation conditions in accordance with the relationships among the film formation temperature Ts, the difference Vs–Vf, and the characteristics of the formed film.

The process for forming a film in accordance with the present invention is applicable to a wide variety of films, which are capable of being formed with the vapor phase growth technique utilizing the plasma. Examples of the films, to which the process for forming a film in accordance with the present invention is applicable, include an electrical insulating film, a dielectric film, and a piezoelectric film.

The process for forming a film in accordance with the present invention is capable of being applied appropriately to the film formation of a piezoelectric film containing at least one kind of perovskite type oxide, which piezoelectric film may contain inevitable impurities. The piezoelectric film containing the perovskite type oxide is a ferroelectric film, which exhibits spontaneous polarization characteristics at the time free from voltage application.

Figure 11:
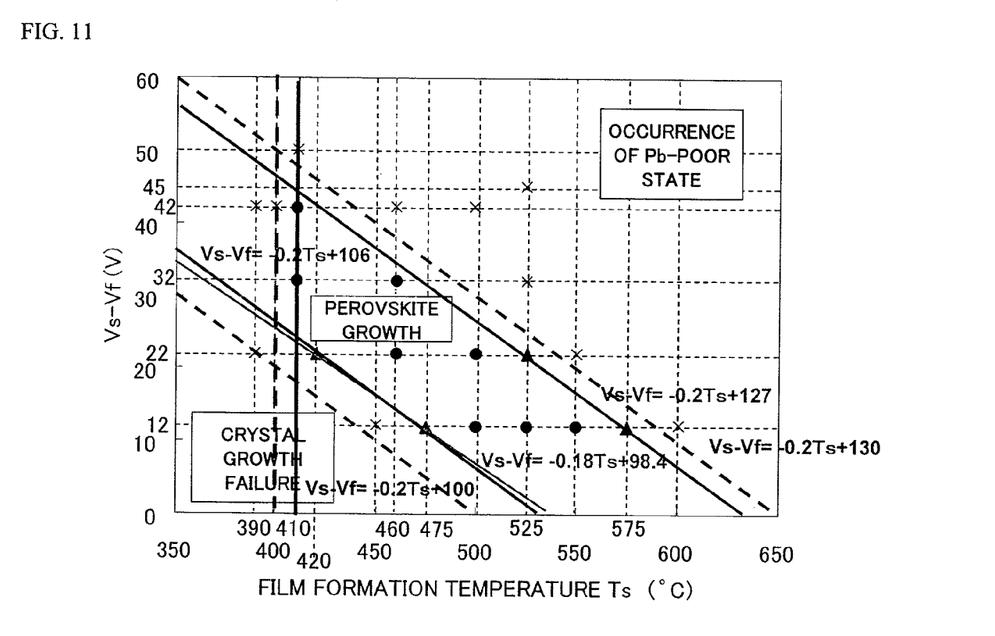
FIG. 11 is a graph showing results of XRD measurements made on all of samples of Examples 1, 2 and 3, wherein the film formation temperature Ts is plotted on the horizontal axis, and wherein the difference Vs−Vf is plotted on the vertical axis. Specifically.

The inventors found that, in cases where the process for forming a film in accordance with the present invention is applied to the film formation of a piezoelectric film containing at least one kind of perovskite type oxide, which may be represented by General Formula (P) shown below, the film formation conditions should preferably be determined within a range such that Formulas (1) and (2) shown below are satisfied (as illustrated in FIG. 11):

$$\text{General Formula } A_a B_b O_3 \tag{P}$$

wherein A represents the element at the A site and represents at least one kind of element, including Pb, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, Ni, and lanthanide elements, and O represents the oxygen atom, the standard composition being such that a=1.0, and at the same time b=1.0, with the proviso that each of the value of a and the value of b may deviate from 1.0 within a range such that the perovskite structure is capable of being formed, $$Ts(°C.) \geq 400 \tag{1}$$

$$-0.2Ts+100 < Vs-Vf(V) < -0.2Ts+130 \tag{2}$$

Examples of the perovskite type oxides, which may be represented by General Formula (P) shown above, include lead-containing compounds, such as lead titanate, lead zirconate titanate (PZT), lead zirconate, lead lanthanum titanate, lead lanthanum zirconate titanate, magnesium niobate lead zirconate titanate, and nickel niobate lead zirconate titanate; and lead-free compounds, such as barium titanate, bismuth sodium titanate, bismuth potassium titanate, sodium niobate, potassium niobate, and lithium niobate. The piezoelectric film may contain one of mixed crystal systems of the perovskite type oxides, which may be represented by General Formula (P) shown above.

The present invention is applicable appropriately to PZT, which may be represented by General Formula (P-1) shown below, a B site substituted system of PZT described above, and a mixed crystal system containing PZT described above and the B site substituted system of PZT described above:

$$Pb_a(Zr_{b1}Ti_{b2}X_{b3})O_3 \tag{P-1}$$

wherein X represents at least one kind of metallic element selected from the group consisting of Group V and Group VI elements, a>0, b1>0, b2>0, and b3≥0, the standard composition being such that a=1.0, and at the same time b1+b2+b3=1.0, with the proviso that each of the value of a and the value of b1+b2+b3 may deviate from 1.0 within a range such that the perovskite structure is capable of being formed.

The perovskite type oxide represented by General Formula (P-1), wherein b3=0, is lead zirconate titanate (PZT). The perovskite type oxide represented by General Formula (P-1), wherein b3>0, is the oxide, in which a part of the B site of PZT has been substituted by X that represents at least one kind of metallic element selected from the group consisting of Group V and Group VI elements.

X may represent at least one kind of metallic element selected from the elements of Groups VA, VB, VIA and VIB. X should preferably represent at least one kind of metallic element selected from the group consisting of V, Nb, Ta, Cr, Mo, and W.

With respect to the film formation of the piezoelectric film containing the perovskite type oxide, which may be represented by General Formula (P) shown above, the inventors have found that, under the film formation conditions of Ts (° C.)<400, which do not satisfy Formula (1) shown above, since the film formation temperature is markedly low, the perovskite crystal is not capable of growing appropriately, and the film primarily containing the pyrochlore phase is formed. (Reference may be made to FIG. 11.)

Also, with respect to the film formation of the piezoelectric film containing the perovskite type oxide, which may be represented by General Formula (P) shown above, the inventors have found that, under the film formation conditions of Ts (° C.)≥400, which satisfy Formula (1) shown above, in cases where the film formation conditions are determined within the range such that the film formation temperature Ts and the difference Vs−Vf satisfy Formula (2) shown above, the perovskite crystal containing little pyrochlore phase is capable of being caused to grow reliably, the occurrence of the Pb-poor state is capable of being suppressed reliably, and the piezoelectric film having good quality, which has a good crystal structure and a good film composition, is capable of being formed reliably. (Reference may be made to FIG. 11.)

As for the film formation of PZT with the sputtering technique, it has been known that, in cases where the film formation is performed at a high temperature, the Pb-poor state is apt to occur. (Reference may be made to, for example, FIG. 2 of Japanese Unexamined Patent Publication No. 6(1994)-049638 described above.) The inventors have found that, besides the film formation temperature, the occurrence of the Pb-poor state also depends upon the difference Vs−Vf. Of Pb, Zr, and Ti, which are the constituent elements of PZT, Pb exhibits the highest sputtering rate and is apt to be sputtered. For example, in Table 8.1.7 of "Vacuum Handbook," Alvac K. K., published by Ohm Co., it is described that the sputtering rates under the conditions of Ar ion 300 ev are such that Pb=0.75, Zr=0.48, and Ti=0.65. The characteristics such that the element is apt to be sputtered represent that the atom is apt to be re-sputtered after the atom has been deposited on the base plate surface. It is considered that, as the difference between the plasma potential and the potential of the base plate becomes large, i.e. as the difference Vs−Vf becomes large, the re-sputtering rate becomes high, and the Pb-poor state becomes apt to occur. The foregoing also applies to the Pb-containing perovskite type oxide other than PZT. The foregoing further applies to the vapor phase growth technique utilizing the plasma other than the sputtering technique.

Under the conditions such that both the film formation temperature Ts and the difference Vs−Vf take markedly small values, there is a tendency that the perovskite crystal is not capable of being caused to grow appropriately. Also, under the conditions such that at least either one of the film formation temperature Ts and the difference Vs−Vf takes a markedly large value, there is a tendency for the Pb-poor state to occur readily.

Specifically, under the film formation conditions of Ts (° C.)≥400, which satisfy Formula (1) shown above, in cases where the film formation temperature Ts is comparatively low, it is necessary for the difference Vs−Vf to be set at a comparatively large value, such that the perovskite crystal may be caused to grow appropriately. Also, under the film formation conditions of Ts (° C.)≥400, which satisfy Formula (1) shown above, in cases where the film formation temperature Ts is comparatively high, it is necessary for the difference Vs−Vf to be set at a comparatively small value, such that the occurrence of the Pb-poor state may be suppressed. The requirements described above are represented by Formula (2) shown above.

The inventors have found that, in cases where the piezoelectric film containing the perovskite type oxide, which may be represented by General Formula (P) shown above, is to be formed, the film formation conditions should preferably be determined within a range such that Formulas (1), (2), and (3) shown below are satisfied:

$$Ts(° C.) \geq 400 \quad (1)$$

$$-0.2Ts+100 < Vs-Vf(V) < -0.2Ts+130 \quad (2)$$

$$10 \leq Vs-Vf(V) \leq 35 \quad (3)$$

The inventors have found that, in such cases, the piezoelectric film having a high piezoelectric constant is capable of being obtained.

By way of example, in cases where the piezoelectric film containing the perovskite type oxide, which may be represented by General Formula (P) shown above, is to be formed, under the conditions such that film formation temperature Ts (° C.)=approximately 420, the difference Vs−Vf (V) may be set to be approximately 42. The inventors have found that, in such cases, though the perovskite crystal free from the Pb-poor state is capable of being caused to grow, the piezoelectric constant $d_{31}$ of the obtained film is as low as approximately 100 pm/V. It is considered that, under the conditions described above, wherein the difference Vs−Vf is markedly large, i.e. energy of the constituent element Tp of the target T, which constituent element collides with the base plate, is markedly high, defects are apt to occur in the film, and the piezoelectric constant becomes low. The inventors have found that, in cases where the film formation conditions are determined within the range such that Formulas (1), (2), and (3) shown above are satisfied, the piezoelectric film having a piezoelectric constant $d_{31} \geq 130$ pm/V is capable of being formed.

The present invention clarifies that the factors of the film formation conditions, which factors have the effects upon the film characteristics, in the vapor phase growth technique utilizing the plasma, such as the sputtering technique, are (i) the film formation temperature Ts (° C.), and (ii) the difference Vs−Vf (V), which is the difference between the plasma potential Vs (V) in the plasma at the time of the film formation and the floating potential Vf (V).

With the process for forming a film in accordance with the present invention, wherein the film formation conditions are determined in accordance with the relationships among the two factors described above, which have the effects upon the film characteristics, and the characteristics of the formed film, the film having good quality is capable of being formed reliably with the vapor phase growth technique utilizing the plasma, such as the sputtering technique.

In cases where the process for forming a film in accordance with the present invention is employed, the conditions, under which the film having good quality is capable of being formed, are capable of being found easily for each of different apparatus conditions, and the film having good quality is capable of being formed reliably.

The process for forming a film in accordance with the present invention is capable of being applied appropriately to the formation of the piezoelectric film, and the like. With the present invention, in cases where the piezoelectric film containing the perovskite type oxide is to be formed, the perovskite crystal containing little pyrochlore phase is capable of being caused to grow reliably. Also, with the present invention, in cases where the piezoelectric film containing the Pb-containing perovskite type oxide, such as PZT, is to be formed, the perovskite crystal containing little pyrochlore phase is capable of being caused to grow reliably, and the occurrence of the Pb-poor state is capable of being suppressed reliably.

[Piezoelectric Film]

In cases where the process for forming a film in accordance with the present invention is employed, the piezoelectric film in accordance with the present invention as described below is capable of being furnished.

Specifically, the present invention also provides the piezoelectric film containing at least one kind of perovskite type oxide, which may be represented by General Formula (P) shown below, wherein the piezoelectric film has been formed with the vapor phase growth technique utilizing the plasma, and the piezoelectric film has been formed under film formation conditions satisfying Formulas (1) and (2) shown below:

$$\text{General Formula } A_aB_bO_3 \quad (P)$$

wherein A represents the element at the A site and represents at least one kind of element, including Pb, B represents the element at the B site and represents at least one kind of element selected from the group consisting of Ti, Zr, V, Nb, Ta, Cr, Mo, W, Mn, Sc, Co, Cu, In, Sn, Ga, Zn, Cd, Fe, Ni, and lanthanide elements, and O represents the oxygen atom, the standard composition being such that a=1.0, and at the same time b=1.0, with the proviso that each of the value of a and the value of b may deviate from 1.0 within a range such that the perovskite structure is capable of being formed, $$Ts(° C.) \geq 400 \quad (1)$$

$$-0.2Ts+100 < Vs-Vf(V) < -0.2Ts+130 \quad (2)$$

The present invention is capable of reliably providing the piezoelectric film, which has the perovskite crystal structure containing little pyrochlore phase, in which the occurrence of the Pb-poor state is suppressed reliably, and which has good quality with a good crystal structure and a good film composition.

With the present invention, it is possible to provide the piezoelectric film, in which 1.0≤a and which has the composition free from the Pb-poor state. With the present invention, it is also possible to provide the piezoelectric film, in which 1.0<a and which has the Pb-rich composition. No limitation is imposed upon the upper limit of a. The inventors have found that, in cases where 1.0≤a≤1.3, the piezoelectric film having good piezoelectric performance is capable of being obtained.

The piezoelectric film in accordance with the present invention should preferably be formed under the conditions, which satisfy Formulas (1), (2), and (3) shown below:

$$Ts(° C.) \geq 400 \quad (1)$$

$$-0.2Ts+100 < Vs-Vf(V) < -0.2Ts+130 \quad (2)$$

$$10 \leq Vs - Vf(V) \leq 35 \quad (3)$$

In such cases, it is possible to provide the piezoelectric film having a high piezoelectric constant.

[Piezoelectric Device and Ink Jet Type Recording Head]

Figure 3:
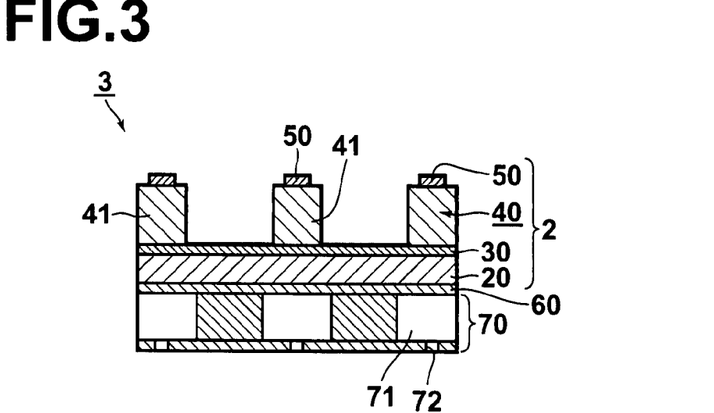
FIG. 3 is a sectional view showing an embodiment of the piezoelectric device in accordance with the present invention and an ink jet type recording head (acting as a liquid discharge apparatus) provided with the embodiment of the piezoelectric device.

An embodiment of the piezoelectric device in accordance with the present invention and an ink jet type recording head (acting as the liquid discharge apparatus in accordance with the present invention), which is provided with the embodiment of the piezoelectric device in accordance with the present invention, will be described hereinbelow with reference to FIG. 3. FIG. 3 is a sectional view showing a major part of an ink jet type recording head (acting as a liquid discharge apparatus), which is provided with an embodiment of the piezoelectric device in accordance with the present invention, the sectional view being taken in the thickness direction of the piezoelectric device. In FIG. 3, for clearness, reduced scales of constituent elements of the ink jet type recording head are varied from actual reduced scales.

With reference to FIG. 3, a piezoelectric device 2 comprises a base plate 20. The piezoelectric device 2 also comprises a bottom electrode 30, a piezoelectric film 40, and top electrodes 50, 50, which are overlaid in this order on a surface of the base plate 20. An electric field is capable of being applied by the bottom electrode 30 and each of the top electrodes 50, 50, . . . in the thickness direction of the piezoelectric film 40.

The bottom electrode 30 is formed over approximately the entire area of the surface of the base plate 20. Also, the piezoelectric film 40 is formed on the bottom plate 30. The piezoelectric film 40 has a pattern comprising line-like protruding areas 41, 41, . . . , which extend along a line normal to the plane of the sheet of FIG. 3 and are arrayed in a striped pattern. Each of the top electrodes 50, 50, . . . is formed on one of the protruding areas 41, 41, . . .

The pattern of the piezoelectric film 40 is not limited to the one illustrated in FIG. 3 and may be designed arbitrarily. Also, the piezoelectric film 40 may be formed as a continuous film. However, in cases where the piezoelectric film 40 is not formed as a continuous film and is formed in the pattern comprising the plurality of the protruding areas 41, 41, . . . separated from one another, the expansion and the contraction of each of the protruding areas 41, 41, . . . are capable of occurring smoothly, and therefore a large displacement quantity is capable of being obtained. Accordingly, the piezoelectric film 40 should preferably be formed in the pattern comprising the plurality of the protruding areas 41, 41, . . . separated from one another.

No limitation is imposed upon a material of the base plate 20. Examples of the materials of the base plate 20 include silicon, glass, stainless steel (SUS), yttrium stabilized zirconia (YSZ), alumina, sapphire, and silicon carbide. The base plate 20 may also be constituted of a laminate base plate, such as an SOI base plate, which contains an $SiO_2$ oxide film having been formed on a surface of a silicon base plate.

No limitation is imposed upon a principal constituent of the bottom electrode 30. Examples of the principal constituents of the bottom electrode 30 include metals, such as Au, Pt, and Ir; metal oxides, such as $IrO_2$, $RuO_2$, $LaNiO_3$, and $SrRuO_3$; and combinations of the above-enumerated metals and/or the above-enumerated metal oxides.

Also, no limitation is imposed upon a principal constituent of the top electrodes 50, 50, . . . Examples of the principal constituents of the top electrodes 50, 50, . . . include the materials exemplified above for the bottom electrode 30; electrode materials ordinarily utilized in semiconductor processes, such as Al, Ta, Cr, and Cu; and combinations of the materials exemplified above for the bottom electrode 30 and/or the above-enumerated electrode materials.

The piezoelectric film 40 is the film having been formed with the process for forming a film in accordance with the present invention. The piezoelectric film 40 should preferably be constituted of the piezoelectric film containing the perovskite type oxide, which may be represented by General Formula (P) shown above.

No limitation is imposed upon the thickness of the bottom electrode 30 and the thickness of each of the top electrodes 50, 50, . . . For example, the thickness of the bottom electrode 30 and the thickness of each of the top electrodes 50, 50, . . . may be approximately 200 nm. Also, no limitation is imposed upon the thickness of the piezoelectric film 40. The thickness of the piezoelectric film 40 may ordinarily be at least 1 μm and may fall within the range of, for example, 1 μm to 5 μm.

An ink jet type recording head (acting as the liquid discharge apparatus in accordance with the present invention) 3 approximately has a constitution, in which a vibrating plate 60 is secured to a bottom surface of the base plate 20 of the piezoelectric device 2 having the constitution described above, and in which an ink nozzle (acting as the liquid storing and discharging member) 70 is secured to the bottom surface of the vibrating plate 60. The ink nozzle 70 comprises a plurality of ink chambers (acting as the liquid storing chambers) 71, 71, . . . , in which ink is to be stored. The ink nozzle 70 also comprises a plurality of ink discharge openings (acting as the liquid discharge openings) 72, 72, . . . , through which the ink is to be discharged from the ink chambers 71, 71, . . . to the exterior of the ink chambers 71, 71, . . . The plurality of the ink chambers 71, 71, . . . are located in accordance with the number and the pattern of the protruding areas 41, 41, . . . of the piezoelectric film 40.

The ink jet type recording head 3 is constituted such that each of the protruding areas 41, 41, . . . of the piezoelectric device 2 is expanded or contracted through alteration of the electric field applied across each of the protruding areas 41, 41, . . . of the piezoelectric device 2, and such that the discharge of the ink from each of the ink chambers 71, 71, . . . and the quantity of the ink discharged from each of the ink chambers 71, 71, . . . are thereby controlled.

The embodiment of the piezoelectric device 2 and the ink jet type recording head 3 are constituted in the manner described above.

[Ink Jet Type Recording System]

Figure 4:
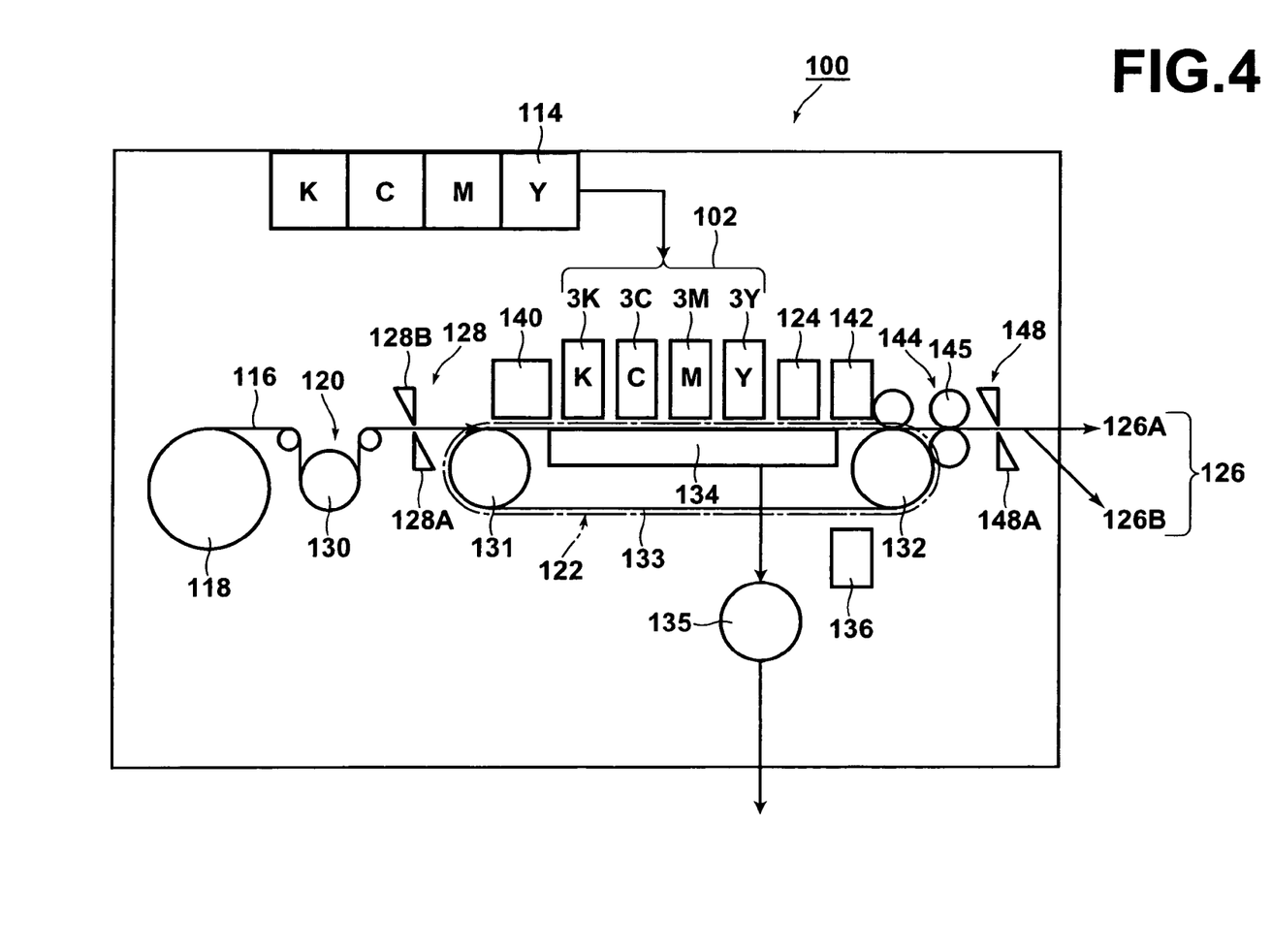
FIG. 4 is a schematic view showing an example of an ink jet type recording system, in which the ink jet type recording head of FIG. 3 is employed.
Figure 5:
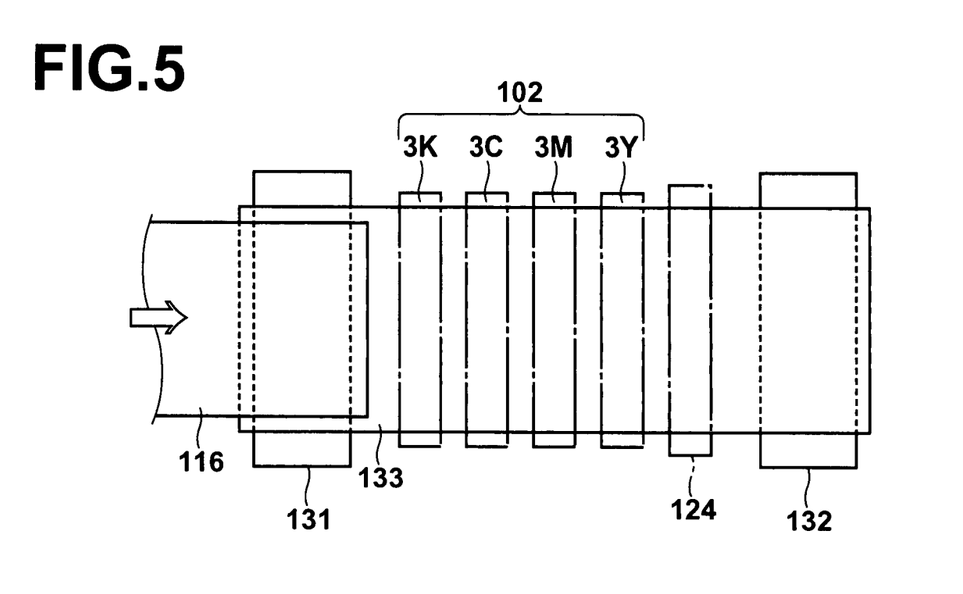
FIG. 5 is a plan view showing a part of the ink jet type recording system of FIG. 4.

An example of an ink jet type recording system, in which the ink jet type recording head 3 of FIG. 1 is employed, will be described hereinbelow with reference to FIG. 4 and FIG. 5. FIG. 4 is a schematic view showing an example of an ink jet type recording system, in which the ink jet type recording head of FIG. 1 is employed. FIG. 5 is a plan view showing a part of the ink jet type recording system of FIG. 4.

With reference to FIG. 4 and FIG. 5, an ink jet type recording system 100 comprises a printing section 102, which is provided with a plurality of ink jet type recording heads (hereinbelow referred to simply as the heads) 3K, 3C, 3M, and 3Y. Each of the heads 3K, 3C, 3M, and 3Y is utilized for one of different ink colors. The ink jet type recording system 100 also comprises an ink stocking and loading section 114 for storing ink compositions, each of which is to be furnished to one of the heads 3K, 3C, 3M, and 3Y. The ink jet type recording system 100 further comprises a paper supply section 118 for supplying recording paper 116. The ink jet type recording system 100 still further comprises a de-curling processing section 120 for eliminating roll set curl of the recording paper 116 having been received from the paper supply section 118. The inkjet type recording system 100 also comprises a suction belt conveyor section 122, which is located so as to stand facing a nozzle bottom surface (i.e., an ink discharge surface) of the printing section 102. The suction belt conveyor section 122 conveys the recording paper 116, while flatness of the recording paper 116 is being kept. The ink jet type recording system 100 further comprises a print detecting section 124 for reading out the results of the printing performed with the printing section 102. The ink jet type recording system 100 still further comprises a paper discharge section 126 for discharging the printed recording paper (i.e., the printed paper) to the exterior of the ink jet type recording system 100.

Each of the heads 3K, 3C, 3M, and 3Y of the printing section 102 is constituted of the aforesaid embodiment of the ink jet type recording head 3.

In the de-curling processing section 120, heat is given by a heating drum 130 to the recording paper 116 in the direction reverse to the direction of the roll set curl, and the de-curling processing is thereby performed.

As illustrated in FIG. 4, in the cases of the ink jet type recording system 100 utilizing the rolled paper, a cutter 128 is located at the stage after the de-curling processing section 120, and the rolled paper is cut by the cutter 128 into a desired size. The cutter 128 is constituted of a stationary blade 128A, which has a length equal to at least the width of the conveyance path for the recording paper 116, and a round blade 128B, which is capable of being moved along the stationary blade 128A. The stationary blade 128A is located on the side of the rear surface of the recording paper 116, which rear surface is opposite to the printing surface of the recording paper 116. Also, the round blade 128B is located on the side of the printing surface of the recording paper 116 with the conveyance path intervening between the stationary blade 128A and the round blade 128B. In the cases of a system utilizing cut paper sheets, the system need not be provided with the cutter 128.

The recording paper 116, which has been subjected to the de-curling processing and has then been cut into the desired size, is sent into the suction belt conveyor section 122. The suction belt conveyor section 122 has the structure, in which an endless belt 133 is threaded over two rollers 131 and 132. The suction belt conveyor section 122 is constituted such that at least a part of the suction belt conveyor section 122, which part stands facing the nozzle bottom surface of the printing section 102 and a sensor surface of the print detecting section 124, may constitute a horizontal surface (a flat surface).

The belt 133 has a width larger than the width of the recording paper 116. The belt 133 has a plurality of suction holes (not shown), which are open at the belt surface. Also, a suction chamber 134 is located within the space defined by the belt 133, which is threaded over the two rollers 131 and 132. Specifically, the suction chamber 134 is located at the position that stands facing the nozzle bottom surface of the printing section 102 and the sensor surface of the print detecting section 124. The region within the suction chamber 134 is evacuated into a negative pressure by use of a fan 135, and the recording paper 116 located on the belt 133 is thereby supported by suction on the belt 133.

Rotation power of a motor (not shown) is transferred to at least either one of the rollers 131 and 132, over which the belt 133 is threaded. The belt 133 is thus rotated clockwise in FIG. 4, and the recording paper 116 having been supported on the belt 133 is thereby conveyed toward the right in FIG. 4.

In the cases of brimless printing, or the like, it will occur that the ink composition clings to the belt 133 beyond the area of the recording paper 116. Therefore, a belt cleaning section 136 is located at a predetermined position on the side outward from the space defined by the belt 133 (specifically, at an appropriate position other than the printing region).

A heating fan 140 is located on the side upstream from the printing section 102 with respect to the paper conveyance path, which is formed by the suction belt conveyor section 122. The heating fan 140 blows dry air against the recording paper 116 before being subjected to the printing and thereby heats the recording paper 116. In cases where the recording paper 116 is thus heated just before the recording paper is subjected to the printing, the ink composition having been jetted out onto the recording paper 116 is capable of drying easily.

As illustrated in FIG. 5, the printing section 102 is constituted of the full-line type heads. Specifically, in the printing section 102, the line type heads having a length corresponding to a maximum paper width are located so as to extend in the direction (i.e., the main scanning direction), which is normal to the paper feed direction. Each of the heads 3K, 3C, 3M, and 3Y is constituted of the line type head provided with a plurality of ink discharge openings (of the nozzles), which are arrayed over a length at least longer than one side of the recording paper 116 of the maximum size to be processed by the ink jet type recording system 100.

The heads 3K, 3C, 3M, and 3Y corresponding to the ink colors are located in the order of black (K), cyan (C), magenta (M), and yellow (Y) from the upstream side with respect to the feed direction of the recording paper 116. The color ink compositions are discharged respectively from the heads 3K, 3C, 3M, and 3Y, while the recording paper 116 is being conveyed. A color image is thus recorded on the recording paper 116.

The print detecting section 124 may be constituted of, for example, a line sensor for imaging the results of the droplet jetting-out operation performed by the printing section 102. The print detecting section 124 thus detects discharge failures, such as nozzle clogging, in accordance with the droplet jetting-out image having been read out by the line sensor.

A post-drying section 142 is located at the stage after the print detecting section 124. The post-drying section 142 may be constituted of, for example, a heating fan for drying the printed image surface. At the stage before the ink composition having been jetted out onto the recording paper 116 dries, the printing surface should preferably be free from contact with a drying member, or the like. Therefore, the post-drying section 142 should preferably employ a drying technique for blowing hot air against the printing surface.

In order to control surface gloss of the image surface, a heating and pressure applying section 144 is located at the stage after the post-drying section 142. In the heating and pressure applying section 144, a pressure is applied to the image surface by a press roller 145 having a predetermined surface recess-protrusion pattern, while the image surface is being heated. The recess-protrusion pattern is thus transferred from the press roller 145 to the image surface.

The printed paper having thus been obtained is then discharged through the paper discharge section 126. Ordinarily, the printed paper, on which a regular image (an object image) to be recorded has been printed, and the printed paper, on which a test printing image has been printed, should preferably be discharged to different destinations. The ink jet type recording system 100 is provided with sorting means (not shown) for sorting out the printed paper, on which the regular image to be recorded has been printed, and the printed paper, on which the test printing image has been printed, and changing over the paper discharge paths to each other in order to send the printed paper, on which the regular image to be recorded has been printed, and the printed paper, on which the test printing image has been printed, into a discharge section 126A and a discharge section 126B, respectively.

In cases where both the regular image to be recorded and the test printing image are printed in parallel on a single large-sized paper sheet at the printing section 102, a cutter 148 may be located in order to separate the paper sheet region, on which the test printing image has been printed, from the paper sheet region, on which the regular image to be recorded has been printed.

The ink jet type recording system 100 is constituted in the manner described above.

(Design Modification)

The present invention is not limited to the embodiments described above and may be embodied in various other ways.

EXAMPLES

The present invention will further be illustrated by the following non-limitative examples.

Example 1

A piezoelectric film containing PZT or Nb-doped PZT was formed by use of the sputtering apparatus as illustrated in FIG. 1, under the conditions of a vacuum degree of 0.5 Pa and in an Ar/O$_2$ mixed atmosphere (O$_2$ volume fraction: 2.5%), by use of a target of Pb$_{1.3}$Zr$_{0.52}$Ti$_{0.48}$O$_3$ or Pb$_{1.3}$Zr$_{0.43}$Ti$_{0.44}$Nb$_{0.13}$O$_3$. The Nb-doped PZT will hereinbelow be referred to as Nb-PZT.

As a base plate for film formation, an electrode-fitted base plate, in which a 30 μm-thick Ti close contact layer and a 150 nm-thick Pt bottom electrode had been overlaid in this order on an Si wafer, was prepared. The base plate/target distance was set at 60 mm.

The base plate was set in the floating state, a ground wire was located at a position, which was spaced apart from the base plate and which was outside of a region between the target and the base plate, and the film formation was performed. At this time, the plasma potential Vs and the floating potential (the potential in the vicinity of the base plate (=approximately 10 mm from the base plate)) Vf were measured. It was found that Vs−Vf (V)=approximately 12.

Figure 6:
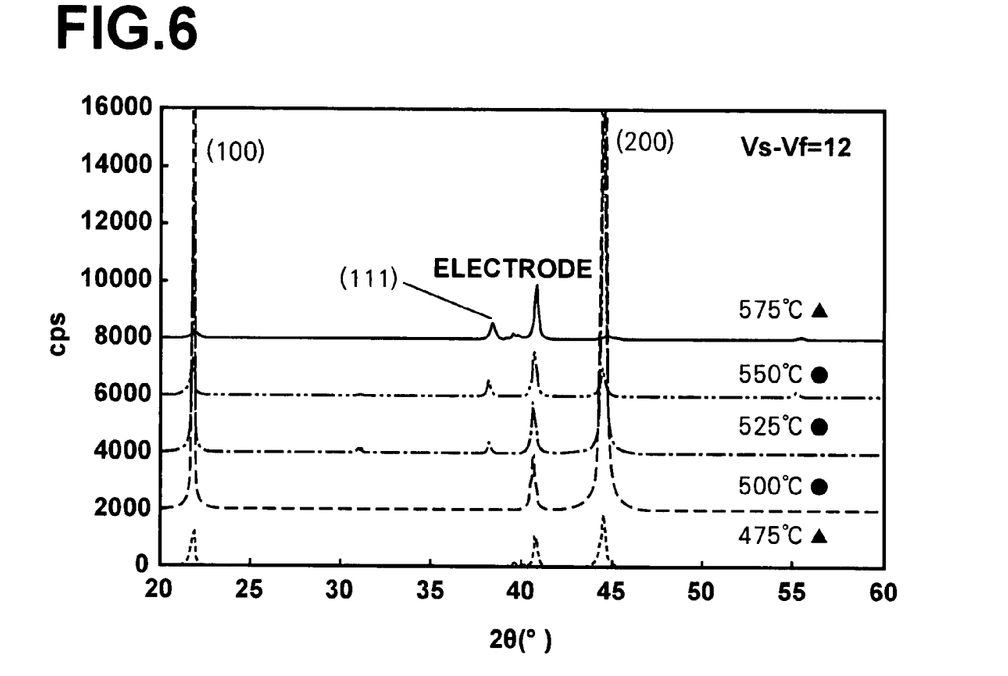
FIG. 6 is a graph showing XRD patterns of principal piezoelectric films, which were obtained in Example 1.

Under the plasma conditions described above, the film formation was performed with the film formation temperature Ts being set at various difference values within the range of 450° C. to 600° C. The Nb-PZT film was formed at the film formation temperature Ts=525° C., and the PZT film was formed at the other values of the film formation temperature Ts. As for the obtained films, X-ray diffraction (XRD) measurement was performed. FIG. 6 illustrates the XRD patterns of the principal films.

As illustrated in FIG. 6, under the conditions of the difference Vs−Vf (V)=approximately 12, the perovskite crystal having crystal orientational characteristics was obtained within the range of the film formation temperature Ts=475° C. to 575° C. At the film formation temperature Ts=450° C., a film primarily containing the pyrochlore phase was obtained. Therefore, the film formation temperature Ts of 450° C. was judged as being "×". At the film formation temperature Ts 475° C., the pyrochlore phase was found in the other samples having been prepared under the same conditions. Therefore, the film formation temperature Ts of 475° C. was judged as being "▲". A decline of the orientational characteristics begun at the film formation temperature Ts=575° C. Therefore, the film formation temperature Ts of 575° C. was judged as being "▲". Also, the film formation temperature Ts of 600° C. was judged as being "×". Within the range of the film formation temperature Ts=500° C. to 550° C., the perovskite crystal having good crystal orientational characteristics was obtained. Therefore, range of the film formation temperature Ts=500° C. to 550° C. was judged as being "●".

Figure 7:
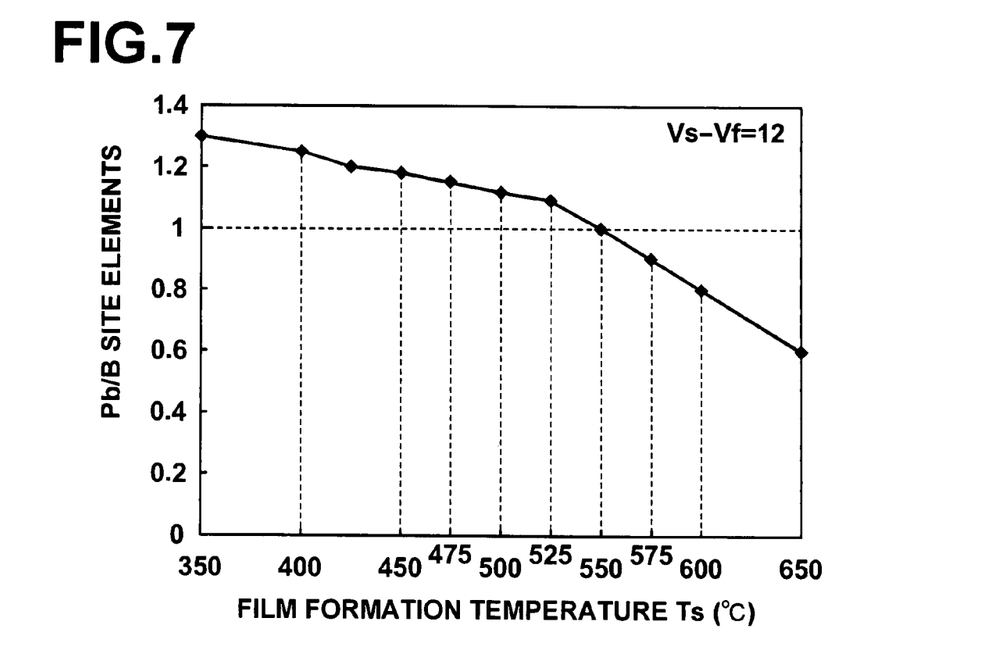
FIG. 7 is a graph showing results of composition analyses of piezoelectric films, which were obtained in Example 1.

As for each of the obtained piezoelectric films, a composition analysis with XRF was performed. The results as illustrated in FIG. 7 were obtained. The term "Pb/B site elements" as used in FIG. 7 represents the ratio of the molar quantity of Pb to the total molar quantity of the B site elements (Zr+Ti, or Zr+Ti+Nb).

As illustrated in FIG. 7, under the conditions of the difference Vs−Vf (V)=approximately 12, the PZT film or the Nb-PZT film, in which 1.0≤Pb/B site elements≤1.3 and which was free from the Pb-poor state, was capable of being formed within the range of the film formation temperature Ts=350° C. to 550° C. However, at the film formation temperature Ts of at most 450° C., the perovskite crystal did not grow due to the insufficiency of the film formation temperature Ts. Also, at the film formation temperature Ts of at least 600° C., the perovskite crystal did not grow due to the occurrence of the Pb-poor state.

For example, the composition of the Nb-PZT film, which was formed under the conditions of Vs−Vf (eV)=approximately 12 and the film formation temperature Ts=525° C., was Pb$_{1.12}$Zr$_{0.43}$Ti$_{0.44}$Nb$_{0.13}$O$_3$.

As for the aforesaid sample having the composition Pb$_{1.12}$Zr$_{0.43}$Ti$_{0.44}$Nb$_{0.13}$O$_3$, a Pt top electrode having a thickness of 100 nm was formed on the piezoelectric film by use of the sputtering technique. The piezoelectric constant d$_{31}$ of the piezoelectric film was measured with a cantilever technique. The piezoelectric constant d$_{31}$ of the piezoelectric film was as high as 250 pm/V and was thus of the appropriate value.

Example 2

Figure 8:
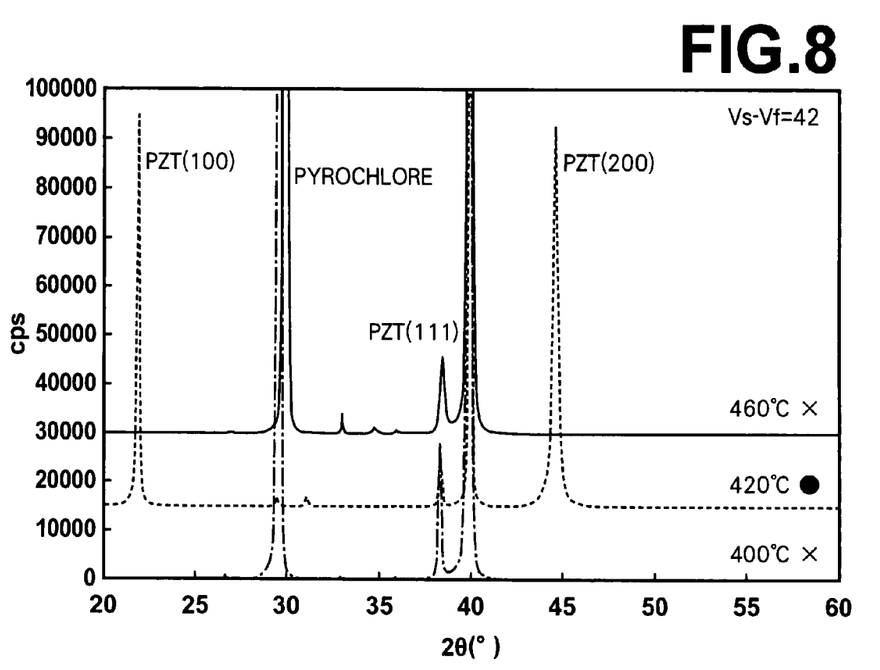
FIG. 8 is a graph showing XRD patterns of principal piezoelectric films, which were obtained in Example 2.

A ground wire was located in the vicinity of the base plate in order for the plasma state of the apparatus to be altered, and the film formation was thus performed. At this time, as in Example 1, the plasma potential Vs and the floating potential Vf were measured. It was found that Vs−Vf=approximately 42V. Under the plasma conditions described above, the PZT film formation was performed with the film formation temperature Ts being set at various difference values within the range of 380° C. to 500° C. As for the obtained films, the XRD measurement was performed. FIG. 8 illustrates the XRD patterns of the principal films.

As illustrated in FIG. 8, under the conditions of the difference Vs−Vf (V)=approximately 42, the perovskite crystal having good crystal orientational characteristics was obtained at the film formation temperature Ts=420° C. Therefore, the film formation temperature Ts 420° C. was judged as being "●". At the film formation temperature Ts of at most 400° C. and the film formation temperature Ts of at least 460° C., a film primarily containing the pyrochlore phase was obtained. Therefore, the film formation temperature Ts of at most 400° C. and the film formation temperature Ts of at least 460° C. were judged as being "×".

Figure 9:
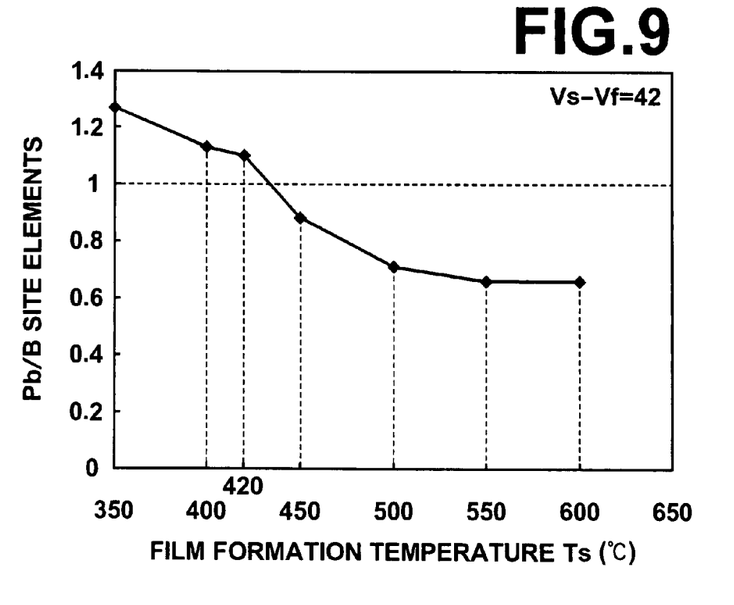
FIG. 9 is a graph showing results of composition analyses of piezoelectric films, which were obtained in Example 2.

In the same manner as that in Example 1, as for each of the obtained PZT films, the composition analysis was performed. The results as illustrated in FIG. 9 were obtained. As illustrated in FIG. 9, under the conditions of the difference Vs−Vf (V)=approximately 42, the PZT film, in which 1.0≤Pb/B site elements≤1.3 and which was free from the Pb-poor state, was capable of being formed within the range of the film formation temperature Ts of 350° C., inclusive, to less than 450° C. However, at the film formation temperature Ts of at most 400°

C., the perovskite crystal did not grow due to the insufficiency of the film formation temperature Ts.

Example 3

The difference Vs–Vf (V) was altered through alteration of the position of the ground wire, and the film formation of the PZT film or the Nb-PZT film were performed. Also, the evaluation was made in the same manner as that in Example 2. With respect to each of the conditions of the difference Vs–Vf (V)=approximately 22, approximately 32, approximately 45, and approximately 50, the film formation temperature Ts was set at various different values, and the film formation was performed. In Examples 1, 2, and 3, the samples having been formed under the film formation conditions of the film formation temperature Ts=525° C. and the difference Vs–Vf (V)=approximately 12, approximately 32, and approximately 45 were the Nb-PZT films. The other samples were the PZT films.

Figure 10:
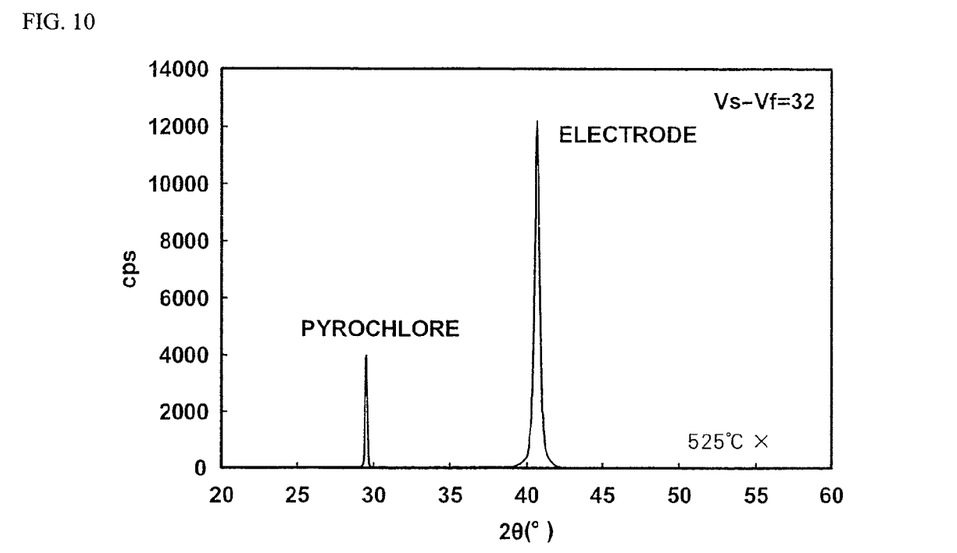
FIG. 10 is a graph showing an XRD pattern of a piezoelectric film, which was obtained in Example 3 under conditions of Vs−Vf(V)=approximately 32 and film formation temperature Ts=525° C.

FIG. 10 shows an example of the sample, which was associated with the XRD measurement results judged as being "x". FIG. 10 illustrates the XRD pattern of the Nb-PZT film, which was formed under the conditions of the difference Vs–Vf (V)=approximately 32 and the film formation temperature Ts=525° C. In FIG. 10, it is illustrated that the film primarily contained the pyrochlore phase.

Summary of the Results of Examples 1, 2, and 3

FIG. 11 is a graph showing results of XRD measurements made on all of samples of Examples 1, 2 and 3, wherein the film formation temperature Ts is plotted on the horizontal axis, and wherein the difference Vs–Vf is plotted on the vertical axis. In FIG. 11, a straight line of Vs–Vf=–0.2Ts+100 and a straight line of Vs–Vf=–0.2Ts+130 are drawn.

FIG. 11 illustrates that, with respect to the PZT film or the Nb-PZT film, in cases where the film formation conditions are determined within the range such that Formulas (1) and (2) shown below are satisfied, the perovskite crystal containing little pyrochlore phase is capable of being caused to grow reliably, the occurrence of the Pb-poor state is capable of being suppressed reliably, and the piezoelectric film having good quality, which has a good crystal structure and a good film composition, is capable of being formed reliably.

$$Ts(° C.) \geq 400 \qquad (1)$$

$$-0.2Ts+100 < Vs-Vf(V) < -0.2Ts+130 \qquad (2)$$

Industrial Applicability

The process for forming a film in accordance with the present invention is applicable to the film formation of a film by use of the vapor phase growth technique utilizing the plasma. The process for forming a film in accordance with the present invention is applicable to the film formation of, for example, the piezoelectric film for use in ink jet type recording heads, ferroelectric memories (FRAM's), and pressure sensors.

What is claimed is:

1. A process for forming a non-epitaxial film on a substrate, in which the non-epitaxial film is formed with a sputtering technique utilizing plasma, the process comprising the steps of:
providing a substrate in a floating state; and
adjusting film formation conditions during said sputtering within a range such that Formulas (1) and (2) shown below are satisfied,
wherein the film is a piezoelectric film containing at least one kind of perovskite oxide, the perovskite oxide being represented by General Formula (P-1) shown below:

$$Pb_a(Zr_{b1}Ti_{b2}X_{b3})O_3 \qquad (P-1)$$

wherein X represents at least one kind of metallic element selected from the group consisting of Group V and Group VI elements, a>0, b1>0, b2>0, and b3≥0, the standard composition being such that a=1.0, and at the same time b1+b2+b3=1.0, wherein each of the value of a and the value of b1+b2+b3 optionally deviates from 1.0 within a range such that the perovskite structure is formed, $$650 \geq Ts(° C.) > 400 \qquad \text{Formula (1)}$$

$$-0.2Ts+100 < Vs-Vf(V) < -0.2Ts+130 \qquad \text{Formula (2)},$$

wherein Ts (° C.) represents a film formation temperature, and Vs–Vf (V) represents the difference between a plasma potential Vs (V) in the plasma at the time of the film formation and a floating potential Vf (V).

2. A process for forming a film as defined in claim 1 wherein the film formation conditions are determined within a range such that Formulas (1), (2), and (3) shown below are satisfied:

$$-0.2Ts+100 < Vs-Vf(V) < -0.2Ts+130 \qquad (2)$$

$$10 \leq Vs-Vf(V) \leq 35 \qquad (3).$$

3. The process according to claim 1, wherein the film formation conditions are determined within a range such that:

$$650 \geq Ts(° C.) \geq 410,$$

$$-0.2Ts+106 \leq Vs-Vf(V) < -0.2Ts+130, \text{ and}$$

$$Vs-Vf \geq 12.$$

4. The process according to claim 1, wherein the film formation conditions are determined within a range such that:

$$650 \geq Ts(° C.) \geq 410,$$

$$-0.2Ts+106 \leq Vs-Vf(V) \leq -0.2Ts+127, \text{ and}$$

$$Vs-Vf \geq 12.$$

5. The process according to claim 1, wherein the film formation conditions are determined within the following two ranges:

410° C. ≤ Ts ≤ 650° C., Vs–Vf < –0.2Ts+130, and Vs–Vf ≥ 22;

and

460° C. ≤ Ts ≤ 650° C., Vs–Vf ≤ –0.2Ts+130, and 12 ≤ Vs–Vf ≤ 22.

6. The process according to claim 1, wherein the film formation conditions are determined within the following two ranges:

410° C. ≤ Ts ≤ 650° C., Vs–Vf ≤ –0.2Ts+127, and Vs–Vf ≥ 22;

and $460°C. \leq Ts \leq 650°C., Vs-Vf \leq -0.2Ts+127,$ and
$12 \leq Vs-Vf \leq 22.$ 7. The process according to claim 1, wherein the point 450° C., 12 V is excluded from the range encompassed by Formulas (1) and (2).

8. The process according to claim 1, wherein the film comprises Pb, and wherein the film formation conditions are determined within a range such that:

$650 \geq Ts(°C.) \geq 410,$ $-0.2Ts+106 \leq Vs-Vf(V) < -0.2Ts+130,$ and $Vs-Vf \geq 12.$ 9. The process according to claim 1, wherein the film comprises Pb, and wherein the film formation conditions are determined within a range such that:

$650 \geq Ts(°C.) \geq 460,$ $-0.2Ts+106 \leq Vs-Vf(V) \leq -0.2Ts+127,$ and $Vs-Vf \geq 12.$ 10. The process according to claim 1, wherein the film comprises Pb, and wherein the film formation conditions are determined within the following two ranges:

$410°C. \leq Ts \leq 650°C., Vs-Vf < -0.2Ts+130,$ and
$Vs-Vf \geq 22;$ and $460°C. \leq Ts \leq 650°C., Vs-Vf < -0.2Ts+130,$ and
$12 \leq Vs-Vf \leq 22.$ 11. The process according to claim 1, wherein the film comprises Pb, and wherein the film formation conditions are determined within the following two ranges:

$410°C. \leq Ts \leq 650°C., Vs-Vf \leq -0.2Ts+127,$ and
$Vs-Vf \geq 22;$ and $460°C. \leq Ts \leq 650°C., Vs-Vf < -0.2Ts+127,$ and
$12 \leq Vs-Vf \leq 22.$ 12. The process according to claim 1, wherein the film comprises Pb, and wherein film forming conditions exclude the point 450° C., 12 V.

13. The process according to claim 1, wherein the film formation conditions are determined within a range such that:

$650 \geq Ts(°C.) \geq 410,$ $-0.18Ts+98.4 \leq Vs-Vf(V) \leq -0.2Ts+127.$

14. The process according to claim 1, wherein the substrate is a Si substrate.

* * * * *